(12) United States Patent
Song

(10) Patent No.: US 12,362,324 B2
(45) Date of Patent: Jul. 15, 2025

(54) STACK TYPE SEMICONDUCTOR DEVICE AND METHOD OF TESTING THE STACK TYPE SEMICONDUCTOR DEVICE

(71) Applicant: SK hynix Inc., Icheon-si (KR)

(72) Inventor: Seong Hwi Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 397 days.

(21) Appl. No.: 17/851,962

(22) Filed: Jun. 28, 2022

(65) Prior Publication Data

US 2023/0307420 A1 Sep. 28, 2023

(30) Foreign Application Priority Data

Feb. 4, 2022 (KR) .......................... 10-2022-0014816

(51) Int. Cl.
| | | |
|---|---|---|
| G11C 5/06 | (2006.01) | |
| G11C 7/10 | (2006.01) | |
| H01L 21/66 | (2006.01) | |
| H01L 23/00 | (2006.01) | |
| H01L 23/48 | (2006.01) | |
| H01L 25/00 | (2006.01) | |
| H01L 25/065 | (2023.01) | |
| H01L 25/18 | (2023.01) | |

(52) U.S. Cl.
CPC .......... *H01L 25/0657* (2013.01); *H01L 22/12* (2013.01); *H01L 22/34* (2013.01); *H01L 23/481* (2013.01); *H01L 24/08* (2013.01); *H01L 24/80* (2013.01); *H01L 25/50* (2013.01); *H01L 2224/08145* (2013.01); *H01L 2224/80895* (2013.01); *H01L 2224/80896* (2013.01); *H01L 2225/06541* (2013.01); *H01L 2225/06596* (2013.01)

(58) Field of Classification Search
CPC .................. H01L 25/0657; H01L 2224/08145
See application file for complete search history.

(56) References Cited

U.S. PATENT DOCUMENTS

| | | | |
|---|---|---|---|
| 8,586,983 B2 | 11/2013 | Han | |
| 11,054,461 B1 * | 7/2021 | Chong | ................ H01L 25/0657 |
| 2018/0358332 A1 | 12/2018 | Kim | |
| 2021/0065832 A1 | 3/2021 | Kim | |
| 2021/0257040 A1 | 8/2021 | Lee | |
| 2023/0163065 A1 | 5/2023 | Song | |

\* cited by examiner

*Primary Examiner* — Kyoung Lee
*Assistant Examiner* — David J Goodwin
(74) *Attorney, Agent, or Firm* — WILLIAM PARK & ASSOCIATES LTD.

(57) ABSTRACT

A stack type semiconductor device including a first wafer and a second wafer. The first wafer including at least one first chip. The second wafer including at least one second chip electrically connected with the first chip. Each of the first and second chips including a test circuit block, at least one test bonding pad and a hybrid boning member. The test circuit block performing a test operation based on a test signal. The test bonding pad arranged on a bonding surface of each of the first and second chips to transmit the test signal and signals for driving the test circuit block between the first and second chips. The hybrid bonding member electrically connected between the test bonding pads.

10 Claims, 9 Drawing Sheets

1570b-1 or 1570t-1

1590b or 1590t

STACK TYPE SEMICONDUCTOR DEVICE AND METHOD OF TESTING THE STACK TYPE SEMICONDUCTOR DEVICE

CROSS-REFERENCES TO RELATED APPLICATION

The present application claims priority under 35 U.S.C. § 119(a) to Korean application number 10-2022-0014816, filed on Feb. 4, 2022, in the Korean Intellectual Property Office, which is incorporated herein by reference in its entirety.

BACKGROUND

1. Technical Field

Various embodiments generally relate to a semiconductor integrated circuit technology, more particularly, to a stack type semiconductor device including a plurality of stacked wafers bonded to each other, and a method of testing the stack type semiconductor device.

2. Related Art

Recently, in order to increase a memory capacity of a memory device and to reduce an occupying area of the memory device, a technology for stacking a plurality of semiconductor chips or semiconductor dies may be proposed.

Currently, in order to manufacture a compact stack type semiconductor device using a simple process, a plurality of wafers may be bonded to each other, the bonded wafers may be sawed to form a stack type chip.

SUMMARY

According to various examples of embodiments, there may be provided a stack type semiconductor device. The stack type semiconductor device may include a first wafer and a second wafer. The first wafer may include at least one first chip. The second wafer may include at least one second chip electrically connected with the first chip. Each of the first and second chips may include a test circuit block, at least one test bonding pad and a hybrid bonding member. The test circuit block may perform a test operation based on a test signal. The test bonding pad may be arranged on a bonding surface of each of the first and second chips to transmit the test signal and signals for driving the test circuit block between the first and second chips. The hybrid bonding member may be electrically connected between the test bonding pads.

According to various examples of embodiments, there may be provided a stack type semiconductor device. The stack type semiconductor device may include a lower wafer, an upper wafer and a plurality of connection structures. The lower wafer may include a plurality of first chips. Each of the first chips may include a first test logic. The upper wafer may be stacked on the lower wafer. The lower wafer may include a plurality of second chips electrically bonded to the first chips. Each of the second chips may Include a second test logic. The connection structures may be formed through the bonded first and second chips to transmit electrical signals of the first and second chips. The first and second test logics may detect a bond failure of the first and second chips in response to a signal transmitted from at least one of the connection structures.

According to various examples of embodiments, there may be provided a method of testing a stack type semiconductor device. In the method of testing the stack type semiconductor device, a first wafer, which may include a plurality of first chips and each of the first chips may include a first test circuit block, may be provided. Each of the first chips may include at least one first pad. The first test circuit block may be driven in response to a test signal transmitted to the first pad. A second wafer, which may include a plurality of second chips and each of the second chips may include a second test circuit block, may be provided. Each of the second chips may include at least one second pad. The second test circuit block may be driven in response to the test signal transmitted to the second pad. The first wafer and the second wafer may be hybrid-bonded to each other to electrically connect the first pad with the second pad. The first and second test circuit blocks may be selectively or simultaneously driven in response to the test signal transmitted to the first and second pads to detect a bonding failure of the first and second wafers.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments will be described in greater detail with reference to the accompanying drawings. The drawings are schematic illustrations of various embodiments (and intermediate structures). As such, variations from the configurations and shapes of the Illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the embodiments as defined in the appended claims.

The embodiments are described herein with reference to cross-section and/or plan illustrations of idealized embodiments. However, embodiments should not be construed as limiting the concepts. Although a few embodiments will be shown and described, it will be appreciated by those of ordinary skill in the art that changes may be made in these embodiments without departing from the principles and spirit of the disclosure.

It will be understood that when an element or layer is referred to as being "on," "electrically connected to," "connected to" or "coupled to" another element or layer, it can be directly on, directly electrically connected to, directly connected or coupled to the other element or layer or intervening elements or layers may be present. In contrast, when an element is referred to as being "directly on," "directly electrically connected to," "directly connected to" or "directly coupled to" another element or layer, there are no intervening elements or layers present. Like numerals refer to like elements throughout.

It will be understood that, although the terms first, second, third etc. may be used herein to describe various levels, circuits, pads, elements, components, regions, layers and/or sections, these levels, circuits, pads, elements, components, regions, layers and/or sections should not be limited by these terms. These terms are only used to distinguish one level, circuit pad, element, component, region, layer or section from another level, circuit, pad, element, component, region, layer or section. Thus, a first level, circuit, pad, element, component, region, layer or section discussed below could be termed a second level, circuit, pad, element, component, region, layer or section without departing from the teachings of the present disclosure.

Hereinafter, a corresponding semiconductor chip may be a semiconductor chip in which elements may be integrated.

Figure 1:
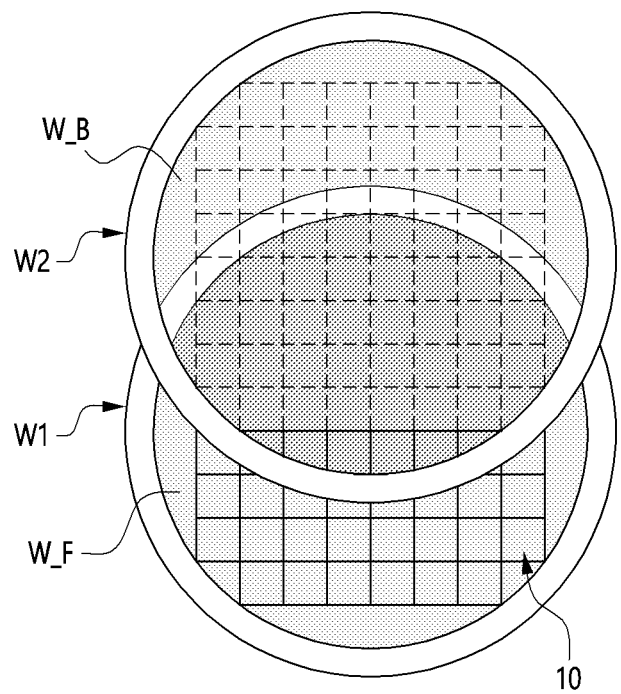
FIG. 1 is a perspective view illustrating a stack type semiconductor device for explaining a wafer bonding in accordance with various examples of embodiments.

FIG. 1 is a perspective view illustrating a stack type semiconductor device for explaining a wafer bonding in accordance with various examples of embodiments.

Referring to FIG. 1, a stack type semiconductor device 100 may include a lower wafer W1 and an upper wafer W2. The upper wafer W2 may be stacked on the lower wafer W1. The upper wafer W2 and the lower wafer W1 may be bonded to each other. The lower wafer W1 and the upper wafer W2 may include at least one through silicon via (TSV) formed through the lower wafer W1 and the upper wafer W2, respectively. Upper surfaces of the lower wafer W1 and the upper wafer W2 may be divided into a plurality of semiconductor chips 10. Although not depicted in drawings, memory elements, a control circuit configured to drive the memory elements, a bonding pad (conductive pad) configured to receive an electrical signal and multi-wirings configured to electrically connect the bonding pad with the memory elements or the control circuit may be arranged a space defined by the semiconductor chips 10. The multi-wirings may be electrically connected between the bonding pad and the TSV.

A front end of line (FEOL) process, for example, a device formation process and a back end of line (BEOL) process, for example, a wiring process for connecting devices with each other may be performed on the lower wafer W1 and the upper wafer W2. After bonding the lower wafer W1 and the upper wafer W2 to each other, a test may be previously performed on the lower wafer W1 and the upper wafer W2.

The lower wafer W1 and the upper wafer W2 may be aligned with each other to face bonding pads of the each of the semiconductor chips each other. The lower wafer W1 and the upper wafer W2 may be bonded to each other by a bonding process, for example, a hybrid bonding process.

Figure 2:
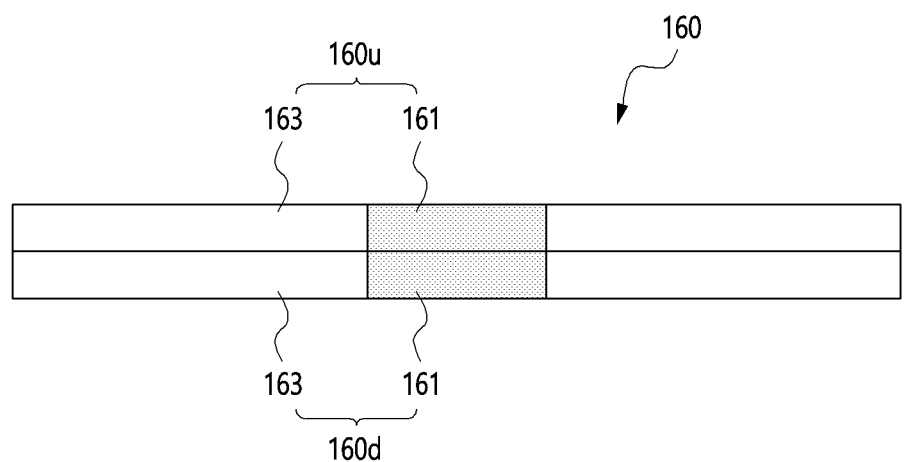
FIG. 2 is a cross-sectional view illustrating a bonding pad for a hybrid bonding in accordance with various examples of embodiments.

FIG. 2 is a cross-sectional view illustrating a bonding pad for a hybrid bonding in accordance with various examples of embodiments.

Referring to FIGS. 1 and 2, a hybrid bonding member 160 may include a lower bonding pad 160*d* and an upper bonding pad 160*u* directly bonded to each other. For example, when the lower wafer W1 and the upper wafer W2 are bonded to each other in a face to face way, the lower bonding pad 160*d* may be positioned on an upper surface W_F of the lower wafer W1 and the upper bonding pad 160*u* may be positioned on an upper surface W_F of the upper wafer W2. Alternatively, when the lower wafer W1 and the upper wafer W2 are bonded to each other in a back to back way, the lower bonding pad 160*d* may be positioned on a lower surface W_B of the lower wafer W1 and the upper bonding pad 160*u* may be positioned on a lower surface W_B of the upper wafer W2.

In various examples of embodiments, FIG. 2 shows a pair of the bonding pads 160*d* and 160*u*. Alternatively, a plurality of bonding pads may be provided to each of the semiconductor chips 10.

Each of the lower bonding pads 160*d* and the upper bonding pads 160*u* may have substantially the same shape. For example, each of the bonding pads 160*u* and 160*d* may include at least one conductive pattern 161 and at least one insulation pattern 163. The conductive pattern 161 and the insulation pattern 163 may be alternately arranged. The conductive pattern 161 may include a conductive layer having an electromigration characteristic such as copper, aluminum, tungsten, a combination thereof, etc. In various examples of embodiments, the conductive pattern 161 may include the copper layer. The insulation pattern 163 may include a silicon oxide layer.

The hybrid bonding process may be performed as follows.

The lower and upper wafers W1 and W2 may be stacked to face the lower bonding pad 160*d* to the upper bonding pad 160*u*. The insulation patterns 163, which may have relatively good contact characteristics, of the upper and lower bonding pads 160*u* and 160*d* may be bonded to each other. Pressure and heat may be applied to the conductive pattern 161 with the insulation patterns 163 being bonded to perform a secondary bonding.

Because the hybrid bonding process may use the heat and pressure, a problem such as a crack may be generated in the wafer during the bonding process. The crack may cause a bonding failure.

However, after the hybrid bonding process, an additional process for testing the bonding failure might not be provided. Thus, after performing a following packaging process, a failure in the semiconductor chip may be detected by a package test. Further, when a failure is detected in the package test after forming a package, it may be difficult to accurately recognize whether the failure is generated in any one step or steps so that the entire package may then be scrapped.

In various examples of embodiments, an individual chip test or a blanket test with respect to the bonded chips may be selectively performed in the stacked wafer level to accurately determine the failure caused by the bonding process.

Figure 3:
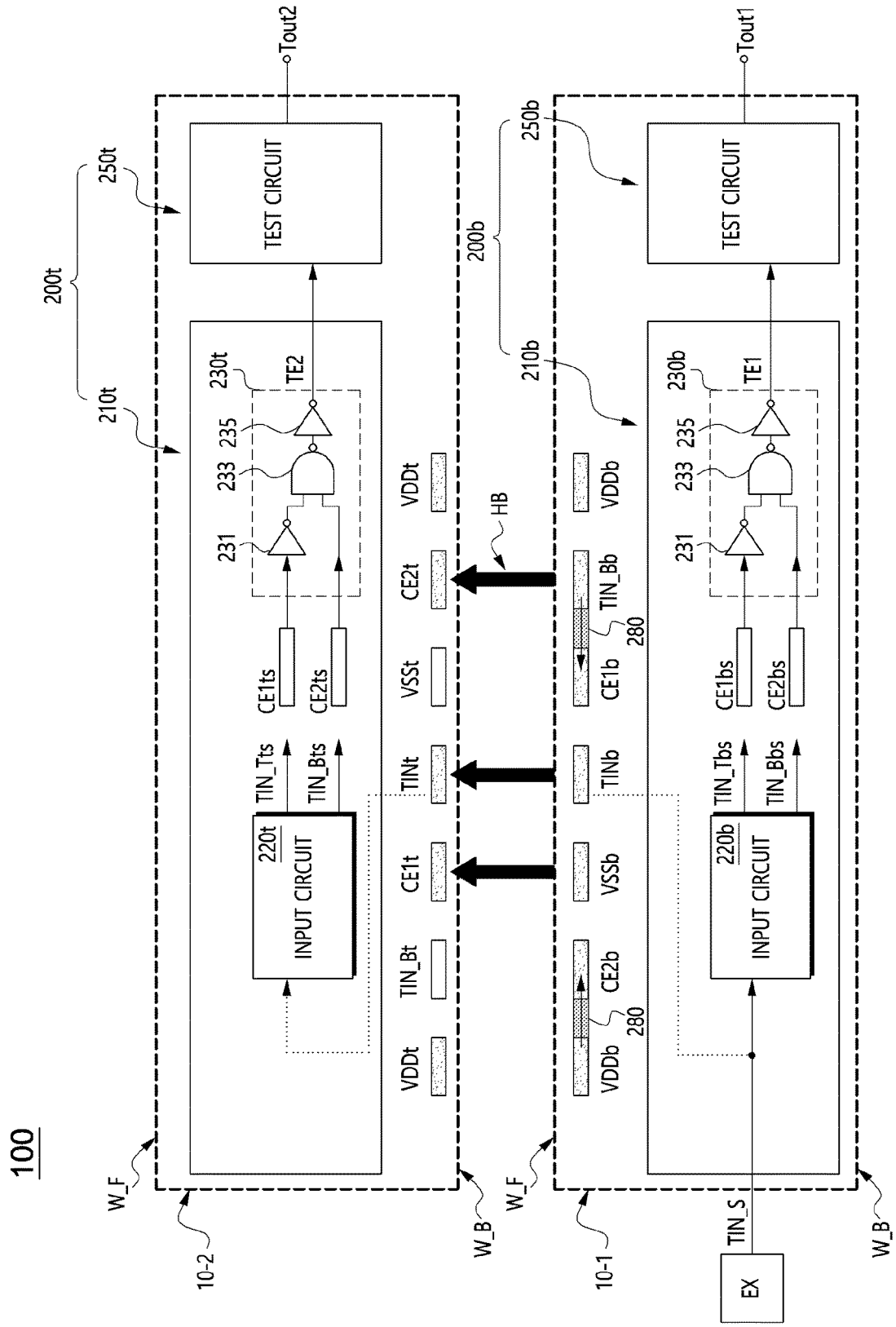
FIG. 3 is a block diagram illustrating a stack type semiconductor device in accordance with various examples of embodiments.

FIG. 3 is a block diagram illustrating a stack type semiconductor device in accordance with various examples of embodiments.

Referring to FIG. 3, a stack type semiconductor device 100 may include a first chip 10-1 and a second chip 10-2 stacked on the first chip 10-1. The first chip 10-1 and the second chip 10-2 may be bonded to each other. Each of the first chip 10-1 and the second chip 10-2 may include test circuit blocks 200b and 200t, respectively. At least one test bonding pad for operating the test circuit blocks 200b and 200t may be arranged on at least one surface of each of the first chip 10-1 and the second chip 10-2.

In various examples of embodiments, the first chip 10-1 and the second chip 10-2 may correspond to a semiconductor chip in a wafer level before sawing a wafer or after sawing the wafer. For example, FIG. 3 may show an upper surface W_F of the first chip 10-1 bonded to a bottom surface W_B of the second chip 10-2. However, the upper surface W_F and the lower surface W_B may be relative. The upper surface W_F and the lower surface W_B may be inversely interpreted viewed from other positions. The facing test bonding pads of the first chip 10-1 and the second chip 10-2 may transmit a same signal therebetween. In various examples of embodiments, when the test bonding pads of the first chip 10-1 and the second chip 10-2 receive the same signal, the test bonding pads of the first chip 10-1 and the second chip 10-2 may transmit the same signal therebetween with the hybrid bonding. A test pad TINb, a first chip selection pad TIN_Bb, a first chip enable pad CE1b, a second chip enable pad CE2b, a driving voltage pad VDDb and a ground voltage pad VSSb as the test bonding pad may be arranged on the upper surface W_F of the first chip 10-1. A signal transmission between wafer or chips hybrid-bonded to each other may be disclosed in U.S. patent application Ser. No. 17/735,755, which may be incorporated herein by reference in its entirety. The first chip selection pad TIN_Bb and the first chip enable signal pad CE1b of the first chip 10-1 may be electrically connected with each other through a redistribution layer 280. The second chip enable pad CE2b and the driving voltage pad VDDb of the first chip 10-1 may also be electrically connected with each other through the redistribution layer 280.

A test pad TINt, a first chip selection pad TIN_Bt, a first chip enable pad CE1t, a second chip enable pad CE2t, a driving voltage pad VDDt and a ground voltage pad VSSt may be arranged on the lower surface W_B of the second chip 10-2 facing the upper surface W_F of the first chip 10-1.

In various examples of embodiments, the test pad TINb of the first chip 10-1 and the test pad TINt of the second chip 10-2 may be electrically connected to each other by a hybrid bonding member HB. The first chip selection pad TIN_Bb of the first chip 10-1 and the second chip enable signal pad CE2t of the second chip 10-2 may be electrically connected to each other by the hybrid bonding member HB. The ground voltage pad VSSb of the first chip 10-1 and the first chip enable pad CE1t of the second chip 10-2 may be bonded to each other by the hybrid bonding member HB.

The first chip selection pad TIN_Bt and the ground voltage pad VSSt of the second chip 10-2 may be floated, not electrically connected to the test bonding pad.

Although parts of the test bonding pads of the first chip 10-1 and the second chip 10-2 may be referred to as a same pad name, the part may receive different signals by the hybrid bonding member HB and the redistribution layer 280. Further, although signals in the first chip 10-1 and the second chip 10-2 may be the same, the signals may have different levels.

For example, the first chip enable pad CE1b of the first chip 10-1 may receive a signal that has been input into the first chip selection pad TIN_Bb. The second chip enable pad CE2b of the first chip 10-1 may be electrically connected with the driving voltage pad VDDb through the redistribution layer 280. Thus, when the first chip selection pad TIN_Bb receives a first chip selection signal TIN_Bbs having a logic low level, the first chip enable pad CE1b of the first chip 10-1 may output a first chip enable signal CE1bs having a logic low level and the second chip enable pad CE2b may output a logic high level of a second chip enable signal CE2bs.

The first chip enable pad CE1t of the second chip 10-2 may be connected with the ground pad VSSb of the first chip 10-1 by the hybrid bonding member HB. The second chip enable pad CE2f of the second chip 10-2 may be connected with the first chip selection pad TIN_Bb by the hybrid bonding member HB. Thus, when the logic low level of the first chip selection signal TIN_Bbs is received from the first chip selection pad TIN_Bb, the first chip enable pad CE1t of the second chip 10-2 may output a logic low level of a first chip enable signal CE1ts. The second chip enable pad CE2t may output a logic low level of a second chip enable signal CE2ts. Although the first chip enable signals CE1bs and CE1ts and the second chip enable signals CE1ts and CE2ts may have the same signal name, parts of the signals may have different levels of voltages in accordance with positions of the semiconductor chips 10-1 and 10-2.

A test bonding pad may also be arranged on a lower surface W_B of the first chip 10-1 and an upper surface W_F of the second chip 10-2 corresponding to an external surface of the stack type semiconductor device 100. For example, the test bonding pads TINt, TIN_Bt, CE1t, CE2t, VDDt and VSSt, which may be arranged on the lower surface W_B of the second chip 10-2, may be additionally arranged on the lower surface W_B of the first chip 10-1. The test bonding pads TINb, TIN_Bb, CE1b, CE2b, VDDb and VSSb, which may be arranged on the upper surface W_F of the first chip 10-1, may be additionally arranged on the upper surface W_F of the second chip 10-2. In an embodiment, at least one of the test bonding pads may be arranged on a bonding surface of the first and second chips 10-1 and 10-2 on either or both the upper and lower surfaces W_F and W_B of the first and second chips 10-1 and 10-2 so that at least one hybrid bonding member HB may electrically connect the test bonding pads of the first and second chips 10-1 and 10-2 with each other.

Each of the test circuit blocks 200b and 200t may include a selection circuit 210b and 210t and a test circuit 250b and 250t. The selection circuit 210b and 210t may include an input circuit 220b and 220t and a driving signal generator 230b and 230t. The test circuit blocks 200b and 200t of the first and second chip 10-1 and 10-2 may have substantially the same configuration, Hereinafter, the configuration of the test circuit block 200b of the first chip 10-1 may be illustrated as an example.

The input circuit 220b may receive a test signal TIN_S from an external device EX. For Example, the external device EX may be an other wafer or a test device. In various examples of embodiments, the input circuit 220b may receive the test signal TIN_S through a test pad on an outer surface of the first and second chips 10-1 and 10-2, for example, the test pad on the lower surface W_B of the first chip 10-1. When the first chip 10-1 corresponds to a lowermost chip in the stack type semiconductor device, the test signal TIN_S may be applied to a test pad on the bottom surface W_B of the first chip 10-1. The test signal TIN_S may be transmitted to the test pad TINb on the upper surface W_F through the TSV. The test signal TIN_S may be transmitted to the test pad TINt of the second chip 10-2, which may be connected with the test pad TINb, through the hybrid bonding member HB.

When another semiconductor chip is positioned under the first chip 10-1, the test signal TIN_S may be transmitted to the first chip 10-1 through a test pad of another semiconductor chip and the test pad on the lower surface W_B of the first chip 10-1. The test signal TIN_S may then be transmitted to the second chip 10-2 through the hybrid bonding member HB.

The Input circuit 220*b* may buffer the test signal TIN_S to output the first chip selection signal TIN_Bbs and the second chip selection signal TIN_Tbs. The first chip selection signal TIN_Bbs and the second chip selection signal TIN_Tbs may have inverse logic levels.

In various examples of embodiments, the first chip selection signal TIN_Bbs may be generated by buffering the test signal TIN_S. The second chip selection signal TIN_Tbs may be generated by inverting the first chip selection signal TIN_Bbs. For example, the input circuit 220*b* may include an internal voltage generator (not shown) or a plurality of inverter chains (not shown). The first chip selection signal TIN_Bbs generated from the input circuit 220*b* may be transmitted to the first chip selection pad TIN_Bb of the first chip 10-1. For example, the first chip selection signal TIN_Bbs may be transmitted to the first chip selection pad TIN_Bb through a TSV and/or a multi-interconnection.

The driving signal generator 230*b* may receive the first chip enable signal CE1*bs* and the second chip enable signal CE2*bs* to generate a first test driving signal TE1 of the first chip 10-1.

The first chip enable signal CE1*bs* may be provided from the first chip enable pad CE1*b* of the first chip 10-1. Because the first chip enable pad CE1*b* may be connected with the first chip selection pad TIN_Bb through the redistribution layer 280, the first chip enable pad CE1*b* may receive the first chip selection signal TIN_Bbs, Thus, the first chip enable signal CE1*bs* may be substantially the same as the first chip selection signal TIN_Bbs.

The second chip enable signal CE2*bs* may be provided from the second chip enable pad CE2*b* of the first chip 10-1. Because the second chip enable pad CE2*b* may be connected with the driving voltage pad VDDb through the redistribution layer 280, the second chip enable pad CE2*b* may receive a driving voltage VDD corresponding to a logic high as the second chip enable signal CE2*bs*. The driving signal generator 230*b* may receive the logic high level of the second chip enable signal CE2*bs*.

When all signals generated by inverting the first chip enable signal CE1*bs* and the second chip enable signal CE2*bs* are a logic high level, the driving signal generator 230*b* may generate the first test driving signal TE1 enabled to low.

In various examples of embodiments, the driving signal generator 230*b* may include a first inverter 231, a NAND gate 233 and a second inverter 235.

The first inverter 231 may invert the first chip enable signal CE1*bs*. The NAND gate 233 may receive the inverted first chip enable signal CE1*bs* and the second chip enable signal CE2*bs* to perform a NAND operation. The second inverter 235 may invert an output signal from the NAND gate 233 to generate the first test driving signal TE1.

The test circuit 250*b* may perform the test operation of the first chip 10-1 in response to the first test driving signal TE1 to output a test result signal Tout1 of the first chip 10-1. The test circuit 250*b* may include all test schemes configured to perform the test in the wafer level. An example of the test circuit 250*b* may be disclosed in U.S. Patent Publication No. 2021/0257040, which may be incorporated herein by reference in its entirety.

The test circuit block 200*t* of the second chip 10-2 may have a configuration substantially the same as the configuration of the test circuit block 200*b* of the first chip 10-1. Thus, any further illustrations with respect to the test circuit block 200*t* of the second chip 10-2 may be omitted herein for brevity. Here, a test pad TINt among the test bonding pads on the lower surface W_B of the second chip 10-2 may be hybrid-bonded to the test pad TINb of the first chip 10-1 to receive the test signal TIN_S. Further, the first chip enable pad CE1*t* of the second chip 10-2 may be hybrid-bonded to the ground voltage pad VSSb of the first chip 10-1 to continuously receive the logic low voltage. The second chip enable pad CE2*t* of the second chip 10-2 may be hybrid-bonded to the first chip selection pad TIN_Bb of the first chip 10-1 to receive the first chip selection signal TIN_Bbs.

Hereinafter, an individual test operation of the stack type semiconductor device 100 in accordance with various examples of embodiments may be illustrated in detail.

When the logic low level of the test signal TIN_S is input, the first chip 10-1 may be tested. In contrast, when the logic high level of the test signal TIN_S is input, the second chip 10-2 may be tested.

The low level of the test signal TIN_S may be received through the test pad of the first chip 10-1. The test signal TIN_S may be transmitted to the input circuit 220*b* of the first chip 10-1 and the input circuit 220*t* of the second chip 10-2.

The input circuits 220*b* and 220*t* may buffer the test signal TIN_S to output the logic low level of the first chip selection signals TIN_Bbs and TIN_Bts and the logic high level of the second chip selection signals TIN_Tbs and TIN_Tts.

The driving signal generators 230*b* and 230*t* may receive the first chip enable signals CE1*bs* and CE1*ts* and the second chip enable signals CE2*bs* and CE2*ts*.

Particularly, the driving signal generator 230*b* of the first chip 10-1 may receive the first chip enable signal CE1*bs* and the second chip enable signal CE2*bs* to output the first test driving signal TE1. As mentioned above, the first chip enable signal CE1*bs* of the first chip 10-1 may correspond to the logic low level of the first chip selection signal TIN_Bbs. The second chip enable signal CE2*bs* may have the logic high level corresponding to the driving voltage VDD. Thus, the driving signal generator 230*b* may output the first test driving signal TE1 enabled to the high level.

The driving signal generator 230*t* of the second chip 10-2 may receive the first chip enable signal CE1*ts* and the second chip enable signal CE2*ts* to output the second test driving signal TE2. As mentioned above, the first chip enable signal CE1*ts* may be transmitted from the first chip enable pad CE1*t* bonded to the ground voltage pad VSSb by the hybrid bonding member HD so that the first chip enable signal CE1*ts* may continuously have the logic low level. The second chip enable signal CE2*ts* may be transmitted from the second chip enable pad CE2*t* bonded to the first chip selection pad TIN_Bb by the hybrid bonding member HB so that the second chip enable signal CE2*ts* may be substantially the same as the first chip selection signal TIN_Bbs.

Thus, the driving signal generator 230t of the second chip 10-2 may receive the logic low level of the first chip enable signal CE1ts and the logic low level of the second chip enable signal CE2ts to output the second test driving signal TE2 enabled to the low level. The test circuit 250t of the second chip 10-2 might not be driven in accordance with the second test driving signal TE2 disabled to the low level.

As a result, when the low level of the test signal TIN_S is input through any one of the test pads of the first and second chips 10-1 and 10-2 hybrid-bonded to each other, the first test driving signal TE1 may be enabled to drive the test circuit 250b of the first chip 10-1. The test circuit 250b may test the first chip 10-1 to output the test result signal Tout1.

The high level of the test signal TIN_S may be received from the external device. The test signal TIN_S may be transmitted to the test pads TINb and TINt of the first chip 10-1 or the second chip 10-2 bonded to each other using the hybrid bonding member HB.

The high level of the test signal TIN_S may be input into the input circuit 220b of the first chip 10-1. The input circuit 220b may output the first chip selection signal TIN_Bbs, which may have a level substantially the same as the level of the test signal TIN_S, and the second chip selection signal TIN_Tbs, which may have a level opposite to the level of the test signal TIN_S. Similarly, the high level of the test signal TIN_S may be input into the input circuit 220t of the second chip 10-2. The input circuit 220t may output the high level of the first chip selection signal TIN_Bts, which may have a level substantially the same as the level of the test signal TIN_S, and the low level of the second chip selection signal TIN_Tts, which may have a level opposite to the level of the test signal TIN_S.

As mentioned above, the driving signal generator 230b of the first chip 10-1 may receive the low level of the first chip enable signal CE1bs, which may have the level substantially the same as the level of the first chip selection signal TIN_Bbs, and the high level of the second chip enable signal CE2bs, which may have a level substantially the same as the level of the driving voltage VDD. Because the level of the first chip selection signal TIN_Bbs may be substantially the same as the level of the test signal TIN_S, the first chip enable signal CE1bs may have the logic high level. Thus, the driving signal generator 230b may output the first test driving signal TE1 enabled to the low level based on the logic high level of the first chip enable signal CE1bs and the logic high level of the second chip enable signal CE2bs. The test circuit 250b might not be driven in accordance with the first test driving signal TE1 disabled to the low level.

The driving signal generator 230t of the second chip 10-2 may receive the first chip enable signal CE1ts and the second chip enable signal CE2ts. The first chip enable signal CE1ts of the second chip 10-2 may be provided from the first chip enable pad CE1t hybrid-bonded to the ground voltage pad VSSb by the hybrid bonding member HB so that the first chip enable signal CE1ts may have the logic low level. Because the second chip enable pad CE2t of the second chip 10-2 may be hybrid-bonded to the first chip selection pad TIN_Bb of the first chip 10-1, the second chip enable signal CE2ts of the second chip 10-2 may be generated based on the first chip selection signal TIN_Bbs of the first chip 10-1 to have the logic low level to have the logic low level. The driving signal generator 230t of the second chip 10-2 may generate the second test driving signal TE2 enabled to the high level by the combination of the logic low level of the first chip enable signal CE1ts and the logic high level of the second chip enable signal CE2ts. The test circuit 250t may be driven by the second test driving signal TE2 enabled to the high level.

Therefore, after bonding the wafers, the test circuit 250t may test the second chip 10-2 to output the test result signal Tout2. That is, the test result signal Tout2 may include the failure information of the semiconductor chip caused by the wafer bonding.

Before the bonding process for manufacturing the stack type semiconductor device 100, each of the wafers may be tested to detect a defect of the wafer or a defect of an element on the wafer. After the bonding process for forming the stack type semiconductor device 100, each of the semiconductor chips may be selectively tested by the test circuits 200b and 200t to detect the bonding failure of the first or second chips 10-1 or 10-2.

When the test result signals Tout1 and Tout2 are coincided with the failure information of the wafer test before the wafer bonding, the failure may be determined as the defect of the wafer or the defect of the element on the wafer. In contrast, when the wafer is determined to be normal and the test result signals Tout1 and Tout2 are generated after the wafer bonding, the failure of the first and second chip 10-1 and 10-2 may be generated in the wafer bonding process. Thus, following bonding conditions may be corrected based on the failure information generated in the wafer bonding process.

In various examples of embodiments, the test circuit blocks 200b and 200t having the same structure may be provided to the first and second chips 10-1 and 10-2. Alternatively, the test circuit blocks 200b and 200t having different structures may be provided to the first and second chip 10-1 and 10-2.

Figure 4:
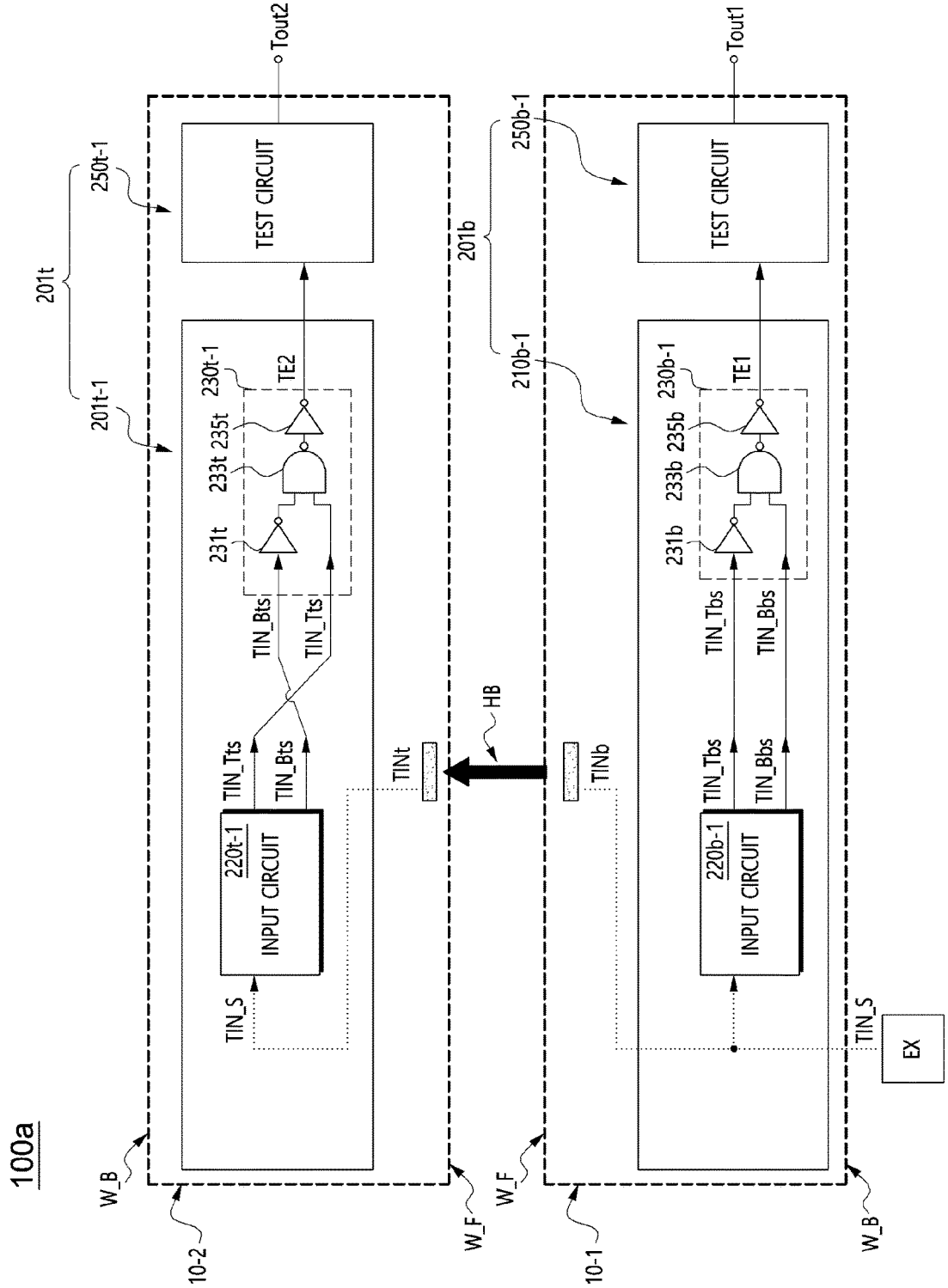
FIG. 4 is a view illustrating a stack type semiconductor device with stack chips including different test circuit blocks in accordance with various examples of embodiments.

FIG. 4 is a view illustrating a stack type semiconductor device with stack chips including different test circuit blocks in accordance with various examples of embodiments.

Referring to FIG. 4, a stack type semiconductor device 100a may include a first chip 10-1 and a second chip 10-2 stacked on the first chip 10-1, The first chip 10-1 and the second chip 10-2 may be bonded to each other. The first and second chips 10-1 and 10-2 may be a part of the wafer. The first and second chips 10-1 and 10-2 may be bonded to each other to face upper surfaces W_F of the first and second chips 10-1 and 10-2 to each other, or the upper surface W_F of the first chip 10-1 to the lower surface W_B of the second chip 10-2. In various examples of embodiments, the upper surface W. F of the first chip 10-1 may face the upper surface W_F of the second chip 10-2. Test pads TINb and TINt may be arranged on the upper surfaces W_F of the first and second chips 10-1 and 10-2. The test pads may also be arranged on the lower surface W_B of the first chip 10-1 and/or the lower surface W_B of the second chip 10-2 corresponding to an external surface of the stack type semiconductor device 100a. A test signal TIN_S may be input to the stack type semiconductor device 100a through any one of the test pads, for example, the test pad on the external surface of the stack type semiconductor device 100a, not limited thereto. For example, the test signal TIN_S may be input through the test pad on the lower surface of the first chip 10-1.

The test pad TINb on the upper surface W_F of the first chip 10-1 may be hybrid-bonded to the test pad TINt on the upper surface W_F of the second chip 10-2 by a hybrid bonding member HB.

Each of the first and second chips 10-1 and 10-2 may include at least one TSV configured to electrically connect the test pad on the lower surface W_B with the test pad on the upper surface W_F.

In various examples of embodiments, the test signal TIN_S, which is input into the test pad on the lower surface W_B of the first chip 10-1, may be transmitted to the test pad TINb on the upper surface W_F of the first chip 10-1 through the TSV in the first chip 10-1.

Because the test pad TINb on the upper surface W_F of the first chip 10-1 may be hybrid-bonded to the test pad TINt on the upper surface of the second chip 10-2, the test signal TIN_S in the test pad TINb may be transmitted to the test pad TINt of the second chip 10-2 through the hybrid bonding member HB.

The TSV in the first and second chips 10-1 and 10-2 may be electrically connected with a plurality of conductive paths. At least one of the conductive paths may be electrically connected to a circuit block in each of the first and second chips 10-1 and 10-2, for example, test circuit blocks 201b and 201t.

Each of the test circuit blocks 201b and 201t may Include selection circuits 210b-1 and 210t-1 and test circuits 250b-1 and 250t-1, respectively. The selection circuits 210b-1 and 210t-1 may include an input circuit 220b-1 and 220t-1 and a driving signal generator 230b-1 and 230t-1.

The input circuits 220b-1 and 220t-1 may have a configuration substantially the same as the configuration of the input circuits 220b and 220t in FIG. 3. The input circuits 220b-1 and 220t-1 may receive the test signal TIN_S to output first chip selection signals TIN_Bbs and TIN_Bts and second chip selection signals TIN_Tbs and TIN_Tts.

The driving signal generator 230b-1 of the first chip 10-1 may receive the first chip selection signal TIN_Bbs and the second chip selection signal TIN_Bbs to generate a first test driving signal TE1.

The driving signal generator 230b-1 of the first chip 10-1 and the driving signal generator 230t-1 of the second chip 10-2 may have a configuration substantially the same as the configuration of the driving signal generators 230b and 230t in FIG. 3.

A first inverter 231b of the driving signal generator 230b-1 in the first chip 10-1 may receive the second chip selection signal TIN_Tbs in place of the first chip enable signal CE1bs in FIG. 3. A NAND gate 233b may receive the first chip selection signal TIN_Bbs in place of the second chip enable signal CE2bs. The NAND gate 233b may receive an inverted second chip selection signal to perform a NAND operation. A second inverter 235b may invert an output signal of the NAND gate 233b to output the first test driving signal TE1.

A first inverter 231t of the driving signal generator 230t-1 in the second chip 10-2 may receive the first chip selection signal TIN_Bts in place of the first chip enable signal CE1ts in FIG. 3. A NAND gate 233t may receive the second chip selection signal TIN_Tts in place of the second chip enable signal CE2ts. The NAND gate 233t may receive an inverted first chip selection signal to perform a NAND operation. A second inverter 235t may invert an output signal of the NAND gate 233t to output the second test driving signal TE2.

The test circuits 250b-1 and the 250t-1 may output test result signals Tout1 and Tout2 including failure information of the first and second chips 10-1 and 10-2 based on the first and second test driving signals TE1 and TE2.

Hereinafter, an individual test operation of the stack type semiconductor device 100a in accordance with various examples of embodiments may be illustrated in detail.

When the logic low level of the test signal TIN_S is input into the stack type semiconductor device 100a, the input circuits 220b-1 and 220t-1 may buffer the test signal TIN_S to generate the logic low level of the first chip selection signals TIN_Bbs and TIN_Bts and the logic high level of the second chip selection signals TIN_Tbs and TIN_Tts.

The logic low level of the first chip selection signals TIN_Bbs and TIN_Bts and the logic high level of the second chip selection signals TIN_Tbs and TIN_Tts may be input into the driving signal generators 230b-1 and 230t-1. The driving signal generator 230b-1 of the first chip 10-1 may perform a logic combination of the logic high level of the second chip selection signal TIN_Tbs and the logic low level of the first chip selection signal TIN_Bbs to generate the first test driving signal TE1 disabled to the low level. The driving signal generator 230t-1 of the second chip 10-2 may perform a logic combination of the logic high level of the second chip selection signal TIN_Tts and the logic low level of the first chip selection signal TIN_Bts to generate the second test driving signal TE2 enabled to the high level.

When the high level of the test signal TIN_S is input into the stack type semiconductor device 100a, the input circuits 220b-1 and 220t-1 may buffer the test signal TIN_S to generate the logic high level of the first chip selection signals TIN_Bbs and TIN_Bts and the logic low level of the second chip selection signals TIN_Tbs and TIN_Tts.

The logic low level of the first chip selection signals TIN_Bbs and TIN_Bts and the logic high level of the second chip selection signals TIN_Tbs and TIN_Tts may be directly input Into the driving signal generators 230b-1 and 230t-1. The driving signal generator 230b-1 of the first chip 10-1 may perform a logic combination of the logic low level of the second chip selection signal TIN_Tbs and the logic high level of the first chip selection signal TIN_Bbs to generate the first test driving signal TE1 enabled to the high level. The driving signal generator 230t-1 of the second chip 10-2 may perform a logic combination of the logic low level of the second chip selection signal TIN_Tts and the logic high level of the first chip selection signal TIN_Bts to generate the second test driving signal TE2 disabled to the low level.

Therefore, when the stack type semiconductor device 100a receives the high level of the test signal TIN_S, the test circuit 250b-1 of the first chip 10-1 may be selectively driven to output the test result signal Tout1 including the failure information after the wafer bonding process.

According to various examples of embodiments, the test circuit blocks 201b and 201t by the stacked semiconductor chips 10-1 and 10-2 may have the different structures to reduce numbers of the bonding pads and numbers of redistributions layers connected between the test bonding pads.

Figure 5:
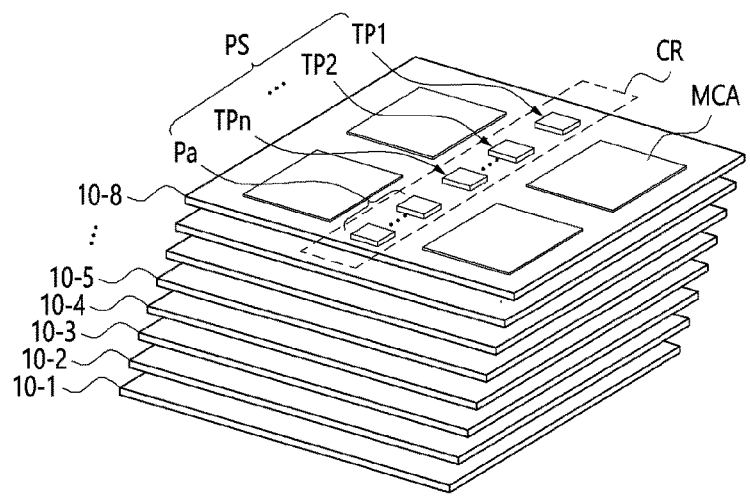
FIG. 5 is a perspective view illustrating a pad arrangement of a stack type semiconductor device in accordance with various examples of embodiments.

FIG. 5 is a perspective view illustrating a pad arrangement of a stack type semiconductor device in accordance with various examples of embodiments.

Referring to FIG. 5, a stack type semiconductor device 100b may include a plurality of stacked chips 10-1~10-8 bonded to each other. As used herein, the tilde "~" indicates a range of components. For example, "10-1~10-8" indicates the stacked chips 10-1, 10-2, . . . , and 10-8 shown in FIG. 5. Each of the chips 10-1~10-8 may include a plurality of memory cell regions MCA and a plurality of pads PS arranged in regions between the memory cell regions MCA. For example, the pads PS may include n numbers of test pads TP1~TPn and at least one signal transmission pad Pa.

In various examples of embodiments, the test pads TP1~TPn may receive a test address signal. The signal transmission pad PA may receive a command signal, a data signal, an address signal and a clock signal. Each of the semiconductor chips 10-1~10-8 may include the test circuit blocks 200b, 201b, 200t and 201t in FIGS. 3 and 4.

In various examples of embodiments, when the stack type semiconductor device 100b includes, stacked, at least three semiconductor chips bonded to each other, the test circuit blocks 200b, 201b, 200t and 201t may further include a chip selector configured to select a chip to be tested. For example, the chip selector may include a circuit configured to receive the test address signals and to decode the test address signals, thereby selecting any one of the semiconductor chips 10-1~10-8. The chip selector may Include a decoding circuit. Bit numbers of the test signal TIN_S may be based on stacked numbers of the semiconductor chips 10-1~10-8.

Figure 6:
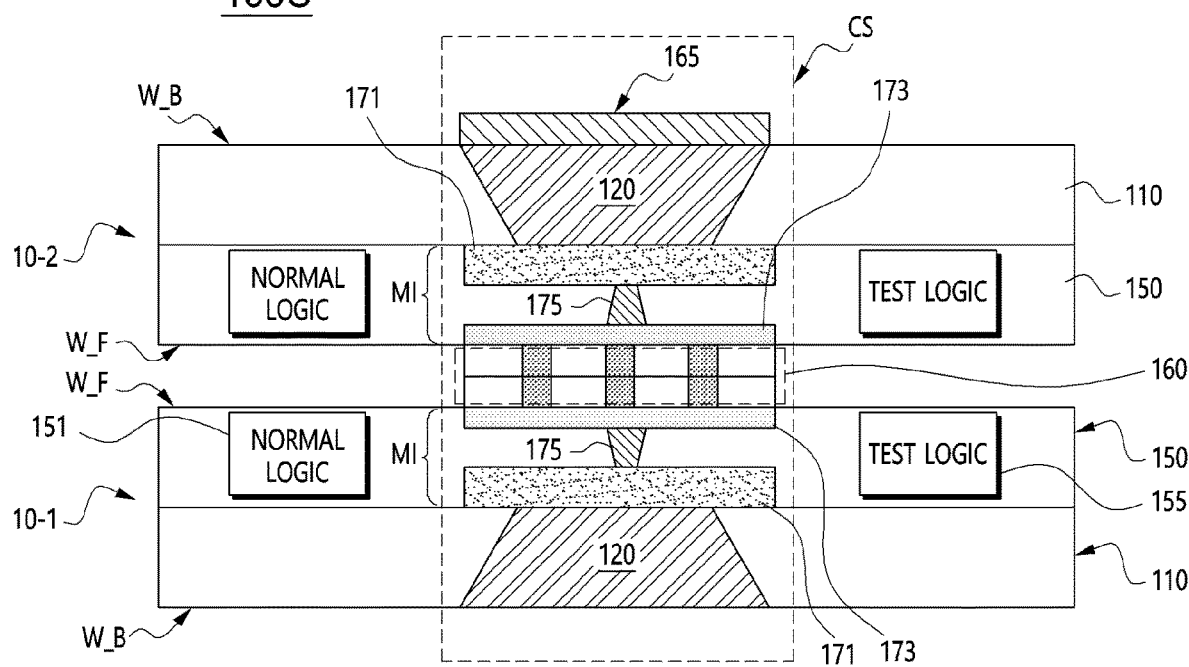
FIG. 6 is a cross-sectional vie-w illustrating a stack type semiconductor device in accordance with various examples of embodiments.

FIG. 6 is a cross-sectional view illustrating a stack type semiconductor device in accordance with various examples of embodiments.

Referring to FIG. 6, a stack type semiconductor device 100c may include a first chip 10-1 and a second chip 10-2 hybrid-bonded to each other. Each of the first and second chips 10-1 and 10-2 may include a semiconductor substrate 110 and a device layer 150. A bottom surface of the semiconductor substrate 110 may correspond to the lower surface W_B of the wafer. An upper surface of the device layer 150 may correspond to the upper surface W_F of the wafer.

A normal logic 151 and a test logic 155 may be integrated in the device layer 150. The normal logic 151 may include memory cells and control circuits in the device layer 150. The control circuits may be configured to operate the memory cells. In various examples of embodiments, the control circuits may include circuits configured to control normal operations such as a write operation, a read operation, and a refresh operation, etc.

The test logic 155 may include circuits configured to detect bonding failure results of the chips 10-1 and 10-2 based on a test signal. In various examples of embodiments, the test logic 155 may correspond to the test circuit blocks 200b, 201b, 200t and 201t In FIGS. 3 and 4.

In various examples of embodiments, the normal logic 151 and the test logic 155 may be integrated in the device layer 150, Alternatively, the memory cells of the normal logic 151 may be arranged on the control circuit of the normal logic 151 and the test logic 155.

The first chip 10-1 and the second chip 10-2 may be electrically connected with each other through a connection structure CS.

The connection structure CS may be configured to physically and electrically connect the stacked first and second chips 10-1 and 10-2 with each other. A plurality of the connection structures CS may be provided to the stacked semiconductor chips 10-1 and 10-2. The connection structure CS a TSV 120 provided to each of the semiconductor chips 10-1 and 10-2, a multi-wiring MI provided to each of the semiconductor chips 10-1 and 10-2 and a hybrid bonding member 160 corresponding to the HB in FIGS. 3 and 4.

The TSV 120 may be formed through the semiconductor substrate 110. The TSV 120 may be configured to directly connect any one of conductive members on the upper surface or the lower surface of the first and second chips 10-1 and 10-2 with any one of conductive members on the lower surface or the upper surface of the first and second chips 10-1 and 10-2. The multi-wiring MI may be arranged in the device layer 150. The multi-wiring MI may include a plurality of conductive layers configured to electrically connect the TSV 120 with the hybrid bonding member 160. For example, the multi-wiring MI may include a first pad 171, a second pad 173 and a wiring 175, The first pad 171 may make contact with a surface of the TSV 120. The second pad 173 may make contact with the hybrid bonding member 160. The wiring 175 may be electrically connected between the first pad 171 and the second pad 173. In FIG. 6, the wiring 175 may include a contact, not limited thereto. For example, the wiring 175 may include various multi-connection wirings.

A part of the wiring 175 may electrically connect the TSV 120 with the normal logic 151. The other part of the wiring 175 may electrically connect the TSV 120 with the test logic 155. Thus, a signal received through the TSV 120 may be transmitted to the normal logic 151 and the test logic 155 through the wiring 175.

In various examples of embodiments, the second pads 173 of the first and second chips 10-1 and 10-2 may be electrically bonded to each other by the hybrid bonding member 160.

A reference numeral 165 may indicate a ball pad or an external pad such as a probe test pad. The external pad 165 may be arranged on at least one of external exposed surfaces of the TSV 120. When an external terminal such as a solder ball may be bonded to the external pad 165, the external pad 165 may correspond to the solder ball. When a needle of a probe tester may make contact with the external pad 165, the external pad 165 may correspond to the probe test pad.

Figure 7:
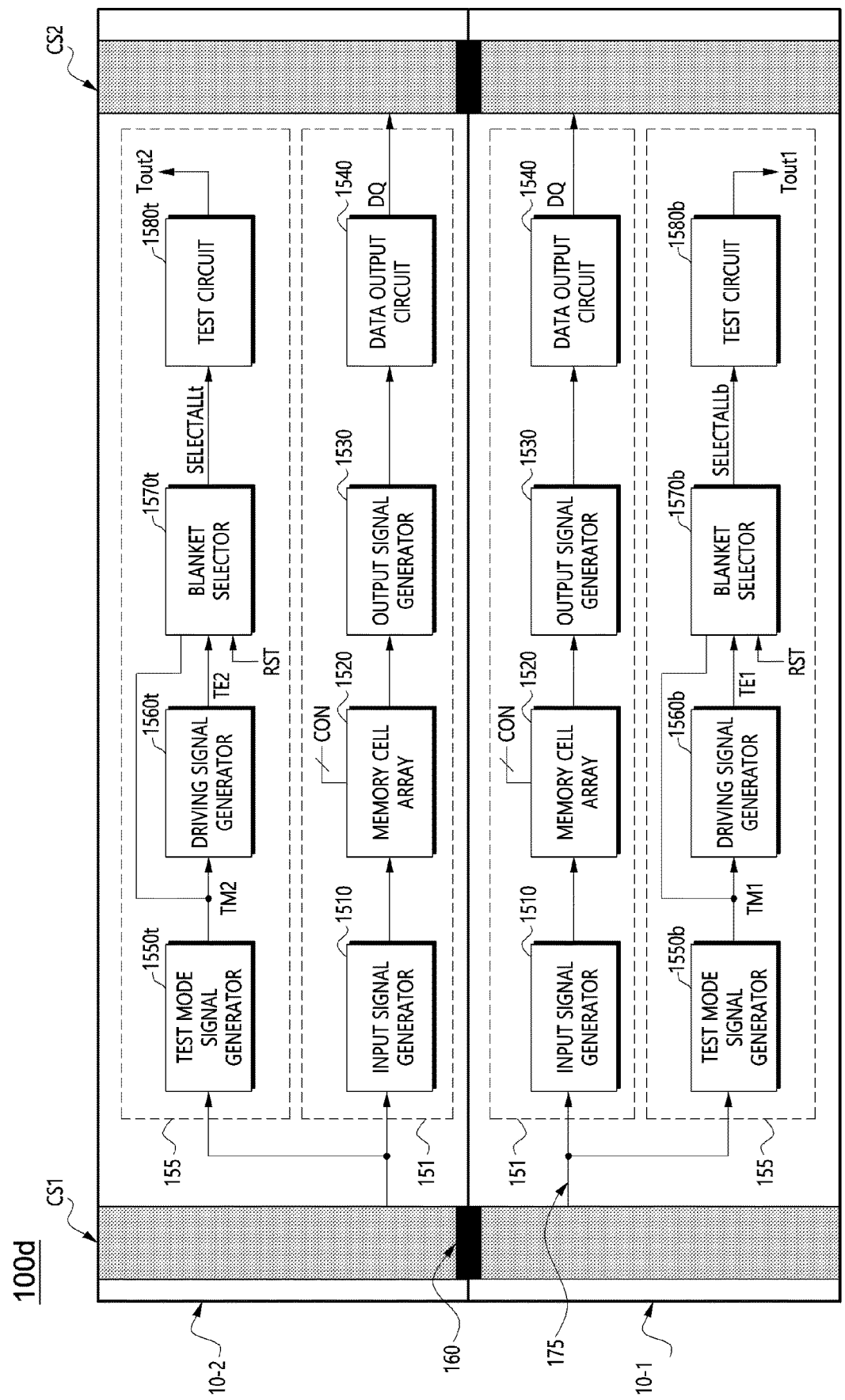
FIG. 7 is a block diagram illustrating a stack type semiconductor device in accordance with various examples of embodiments.

FIG. 7 is a block diagram illustrating a stack type semiconductor device in accordance with various examples of embodiments.

Referring to FIG. 7, a stack type semiconductor device 100d may include a first chip 10-1 and a second chip 10-2 electrically connected with each other through connection structures CS1 and CS2 including a hybrid bonding member 160. Each of connection structures CS1 and CS2 may have a structure substantially the same as the configuration of the connection structure CS in FIG. 6. Thus, any further illustrations with respect to the connection structures CS1 and CS2 may be omitted herein for brevity.

In various examples of embodiments, each of the first and second chips 10-1 and 10-2 may include a normal logic 151 and a test logic 155. The normal logic 151 and the test logic 155 of the first and second chips 10-1 and 10-2 may be driven based on a signal from the first connection structure CS1.

In various examples of embodiments, the normal logic 151 of the first and second chips 10-1 and 10-2 may include an input signal generator 1510, a memory cell array 1520, an output signal generator 1530 and a data output circuit 1540.

The input signal generator 1510 may receive a signal transmitted through the first connection structure CS1 and other signals. The signal input through the first connection structure CS1 may be a signal for setting a position of a test object. The other signals may be a signal for determining an operation of the selected test object. The input signal generator 1510 may combine and process the signal transmitted through the first connection structure CS1 and the other signals to provide the signals with a level for driving the memory cell array 1520, thereby outputting an input signal. The input signal may include at least one signal. The input signal may include a preliminary signal for setting a memory cell as the test object and a preliminary signal for the test operation.

The signal transmitted through the first connection structure CS1 may be transmitted to the input signal generator 1510 through the wiring 175. The other signals may be transmitted to the input signal generator 1510 through inner wirings.

The memory cell array 1520 may receive the input signal and various control signals CON for driving the memory cell array 1520. The memory cell array 1520 may include a plurality of memory cells and a control circuit for operating the memory cells. The control signals CON may be directly and indirectly transmitted to components in the memory cell array 1520 such as a bit line, a word line, etc., and the control circuit. The control circuit may select a tested memory cell among the memory cells in the memory cell array 1520 based on the control signals CON and the input signal to perform the memory operation of the selected memory cell.

The output signal generator 1530 may output a memory operation result of the selected memory cell. For example, the output signal generator 1530 may generate a read signal or a verification signal for verifying a normal programming data in the selected memory cell. The output signal generator 1530 may include a sense amplification circuit or a verification circuit.

The data output circuit 1540 may process an output signal of the output signal generator 1530 using an output data level to output a data signal DQ. The data signal DQ may be transmitted to the second connection structure CS2 through the wiring 175. A configuration and an operation of the normal logic 151 may be disclosed in U.S. Patent Publication No. 2021/0065832, which is incorporated herein by reference in its entirety.

Each of the test logics 155b and 155t of the lower and upper semiconductor substrates 10-1 and 10-2 may include a test mode signal generators 1550b and 1550t, driving signal generators 1560b and 1560t, blanket selectors 1570b and 1570t and test circuits 1580b and 1580t, respectively.

The test mode signal generators 1550b and 1550t may receive signals input from the first connection structure CS1 and/or signals associated with other test operations to generate a first test mode signal TM1 or a second test mode signal TM2. The signals associated with the test operation may include a test command or a mode register signal. The semiconductor chips 10-1 and 10-2 may be actually tested in accordance with the first and second test mode signals TM1 and TM2. The test mode signal generator 1550 may include a data compression circuit. The first test mode signal TM1 and the second test mode signal TM2 may have counter voltage levels.

The driving signal generators 1560b and 1560t may receive the first and second test mode signals TM1 and TM2, respectively. In various examples of embodiments, the driving signal generator 1560b of the first chip 10-1 may generate a first test driving signal TE1 for driving the test circuit 1580b of the first chip 10-1 in response to the first test mode signal TM1. The driving signal generator 1560t of the second chip 10-2 may generate a second test driving signal TE2 for driving the test circuit 1580t of the second chip 10-2 in response to the second test mode signal TM2. When the enabled first test mode signal TM1 or the enabled second test mode signal TM2 is received, the driving signal generator 1560b and 1560t may output the enabled first test driving signal TE1 or the enabled second test driving signal TE2. The driving signal generators 1560b and 1560t may include a buffering circuit. The test mode signal generators 1550b and 1550t and the driving signal generators 1560b and 1560t may correspond to the selection circuits 210b, 210b-1, 210t and 210t-1 in FIGS. 3 and 4.

The blanket selectors 1570b and 1570t may receive the first or second test mode signal TM1 or TM2, the first or second test driving signal TE1 or TE2 and a reset signal RST to output blanket selection signals SELECTALLb and SELECTALLt, respectively. The blanket selector 1570b and 1570t may be configured to generate the blanket selection signals SELECTALLb and SELECTALLt having a simultaneously enabled section. The words "simultaneous" and "simultaneously" as used herein with respect to enabled sections mean that the sections take place on overlapping intervals of time. For example, if a first section takes place over a first interval of time and a second section takes place simultaneously over a second interval of time, then the first and second intervals at least partially overlap each other such that there exists a time at which the first and second sections are both taking place.

The test circuits 1580b and 1580t may be driven based on the blanket selection signals SELECTALLb and SELECTALLt to output test result signals Tout1 and Tout2, respectively. The test circuits 250b and 250t in FIGS. 3 and 4 may be driven based on the first or second test driving signals TE1 or TE2. In contrast, the test circuits 1580b and 1580t may be driven in response to the blanket selection signals SELECTALLb and SELECTALLt generated based on the first or second test driving signals TE1 or TE2. Although the normal logic 151 and the test logic 155 may be independently depicted in FIG. 7, the normal logic 151 of the corresponding chip 10-1 and 10-2 may occupy a part of the test circuits 1580b and 1580t, That is, because the test circuits 1580b and 1580t may detect the failure of the memory cell, the normal circuit 151 for recognizing or testing the operation of the memory cell may also be interpreted as the part of the test circuits 1580b and 1580t.

Figure 8A:
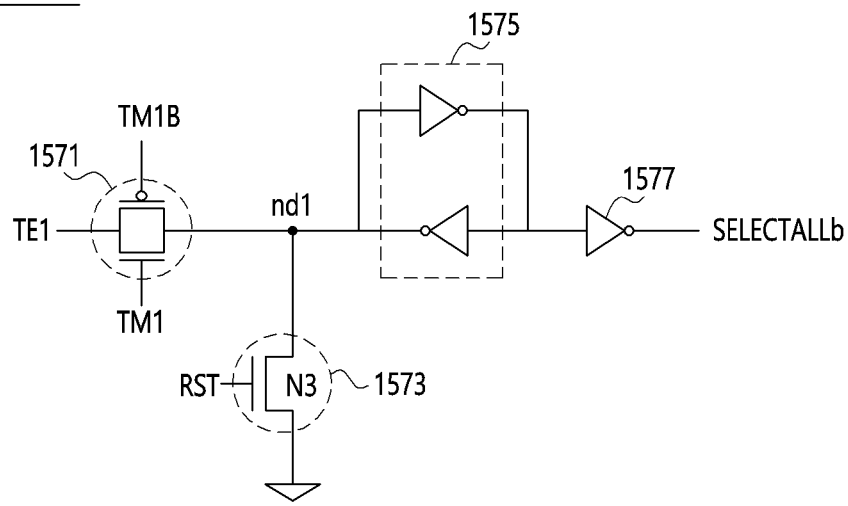
FIG. 8A is a circuit diagram illustrating a selector of a first chip in accordance with various examples of embodiments.
Figure 8B:
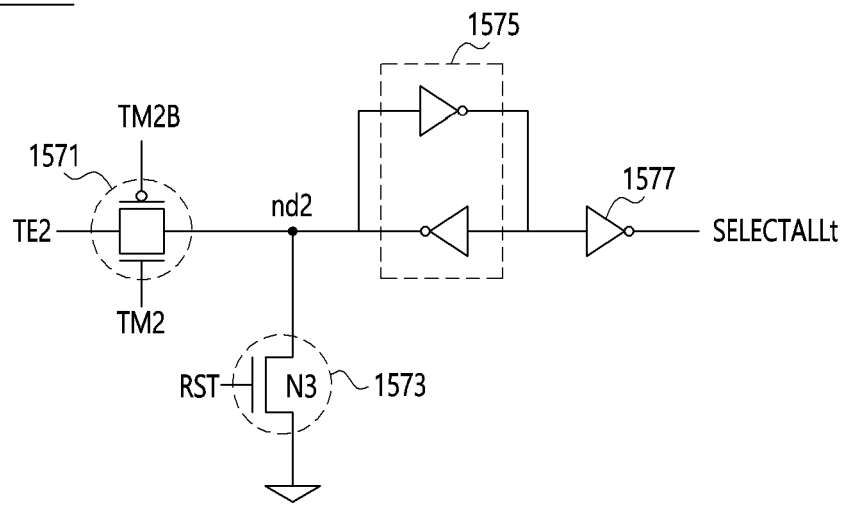
FIG. 8B is a circuit diagram illustrating a selector of a second chip in accordance with various examples of embodiments.
Figure 9:
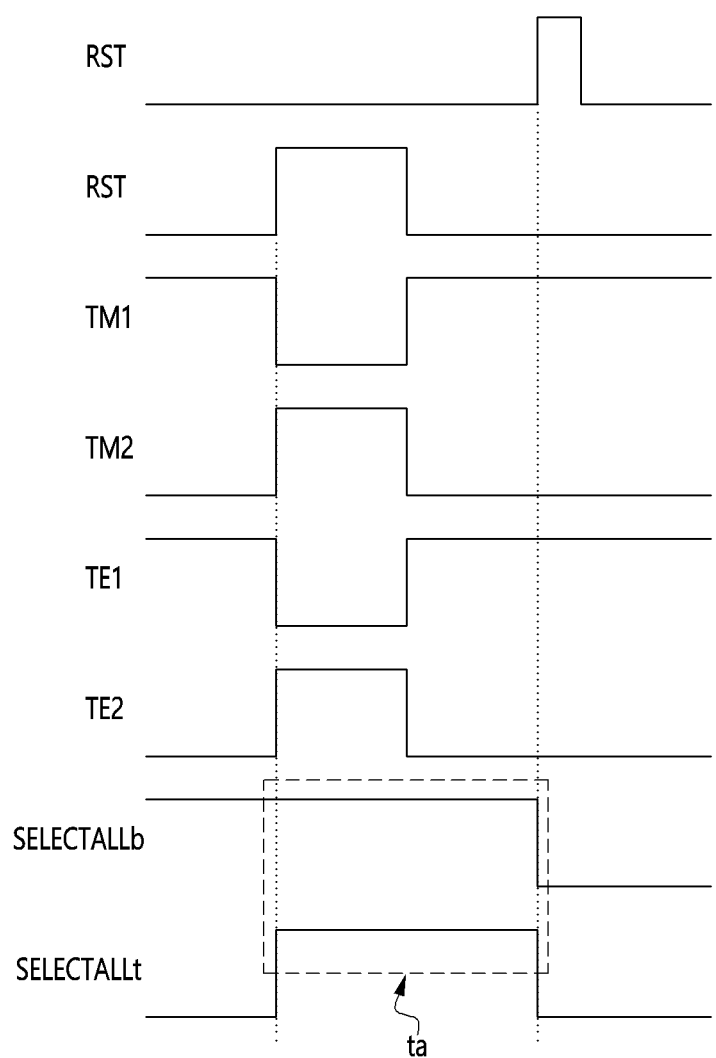
FIG. 9 is a voltage timing chart illustrating a simultaneous test operation of a stack type semiconductor device in accordance with various examples of embodiments.

FIG. 8A is a circuit diagram illustrating a selector of a first chip in accordance with various examples of embodiments, FIG. 8B is a circuit diagram illustrating a selector of a second chip in accordance with various examples of embodiments and FIG. 9 is a voltage timing chart illustrating a simultaneous test operation of a stack type semiconductor device in accordance with various examples of embodiments.

Referring to FIGS. 8A and 8B, the blanket selectors 1570b and 1570t may each include a transfer gate 1571, a reset switch 1573, a latch 1575 and an inverter 1577.

The transfer gate 1571 of the blanket selector 1570b may selectively transmit the first test driving signal TE1 to an output node nd1 in response to the first test mode signal TM1 and an inverted test mode signal TM1B. For example, when the first test mode signal TM1 may be enabled to a high level, the transfer gate 1571 may transmit the first test driving signal TE1 to the output node nd1.

The transfer gate 1571 of the blanket selector 1570t may transmit the second test driving signal TE2 to an output node nd2 in response to the second test mode signal TM2 and an inverted test mode signal TM2B.

The reset switch 1573 may drop a voltage level of the output node nd1 and nd2 in response to the reset signal RST. The reset switch 1573 may include an NMOS transistor connected to the output node nd1 and nd2.

The latch 1575 may be connected to the output node nd1 and nd2 of the transfer gate 1571 to latch the first or second test driving signals TE1 or TE2 output from the transfer gate 1571.

Each inverter 1577 of the FIG. 8A and FIG. 8B may invert an output signal from the latch 1575 to output the blanket signals SELECTALLb and SELECTALLt, respectively.

Hereinafter, the blanket test operation of the stack type semiconductor device in accordance with various examples of embodiments may be illustrated in detail with reference to FIGS. 7 to 9.

Before the blanket test operation is illustrated, when the signals provided to the normal logics 151*b* and 151*t* and the test logics 155*b* and 155*t* from the first connection structure CS are the logic low level, the test mode signal generator 1550*b* may output the first test mode signal TM1 enabled to the logic high level and the test mode signal generator 1550*t* may output the second test mode signal TM2 disabled to the logic low level. In contrast, when the signals provided to the normal logics 151*b* and 151*t* and the test logics 155*b* and 155*t* from the first connection structure CS are the logic high level, the test mode signal generator 1550*b* may output the first test mode signal TM1 disabled to the logic low level and the test mode signal generator 1550*t* may output the second test mode signal TM2 enabled to the logic high level.

In various examples of embodiments, when the logic low level of the signal may be transmitted to the normal logics 151*b* and 151*t* and the test logics 155*b* and 155*t* from the first connection structure CS1, the first test mode signal TM1 may be enabled so that the first chip 10-1 may enter into the test mode for performing the test operation. In contrast, because the second test mode signal TM2 is disabled, the second chip 10-2 may be maintained in a normal operation mode.

The driving signal generator 1560*b* may output the first test driving signal TE1 enabled to the high level based on the first test mode signal TM1. The driving signal generator 1560*t* may output the second test driving signal TE2 disabled to the low level based on the second test mode signal TM2.

The blanket selector 1570*b* of the first chip 10-1 may output the logic high level of the blanket selection signal SELECTALLb in response to the first test mode signal TM1 enabled to the high level and the first test driving signal TE1. The blanket selector 1570*b* may output the logic high level of the blanket selection signal SELECTALLb until the reset signal RST is enabled to the high level.

In contrast, the blanket selector 1570*t* of the second chip 10-2 may output the logic low level of the blanket selection signal SELECTALLt in response to the second test mode signal TM2 disabled to the low level and the second test driving signal TE2.

When the logic high level of the signal is transmitted to the normal logic 151*b* and 151*t* and the test logic 155*b* and 155*t* from the first connection structure CS1, the first test mode signal TM1 may be disabled to the logic low level and the second test mode signal TM2 may be enabled to the logic high level.

The driving signal generator 1560*t* may output the second test driving signal TE2 enabled to the high level based on the second test mode signal TM2. The driving signal generator 1560*b* may output the first test driving signal TE1 disabled to the low level based on the first test mode signal TM1.

The blanket selector 1570*t* of the second chip 10-2 may output the logic high level of the blanket selection signal SELECTALLt in response to the second test mode signal TM2 enabled to the high level and the second test driving signal TE2. The blanket selector 1570*t* may output the logic high level of the blanket selection signal SELECTALLt until the reset signal RST is enabled to the high level. Although the blanket selector 1570*b* of the first chip 10-1 may receive the first test mode signal TM1 disabled to the low level and the first test driving signal TE1, the blanket selector 1570*b* may output the high level of the previous signal as the blanket selection signal SELECTALLb until the reset signal RST is enabled.

Therefore, the blanket selectors 1570*b* and 1570*t* may have the logic high level of the blanket selection signals SELECTALLb and SELECTALLt in a section ta of FIG. 9. Because the test circuits 1580*b* and 1580*t* of the first and second chips 10-1 and 10-2 may be driven in response to the blanket selection signals SELECTALLb and SELECTALLt, the simultaneous test may be performed regardless of the level change of the test mode signals TM1 and TM2.

Figure 10:
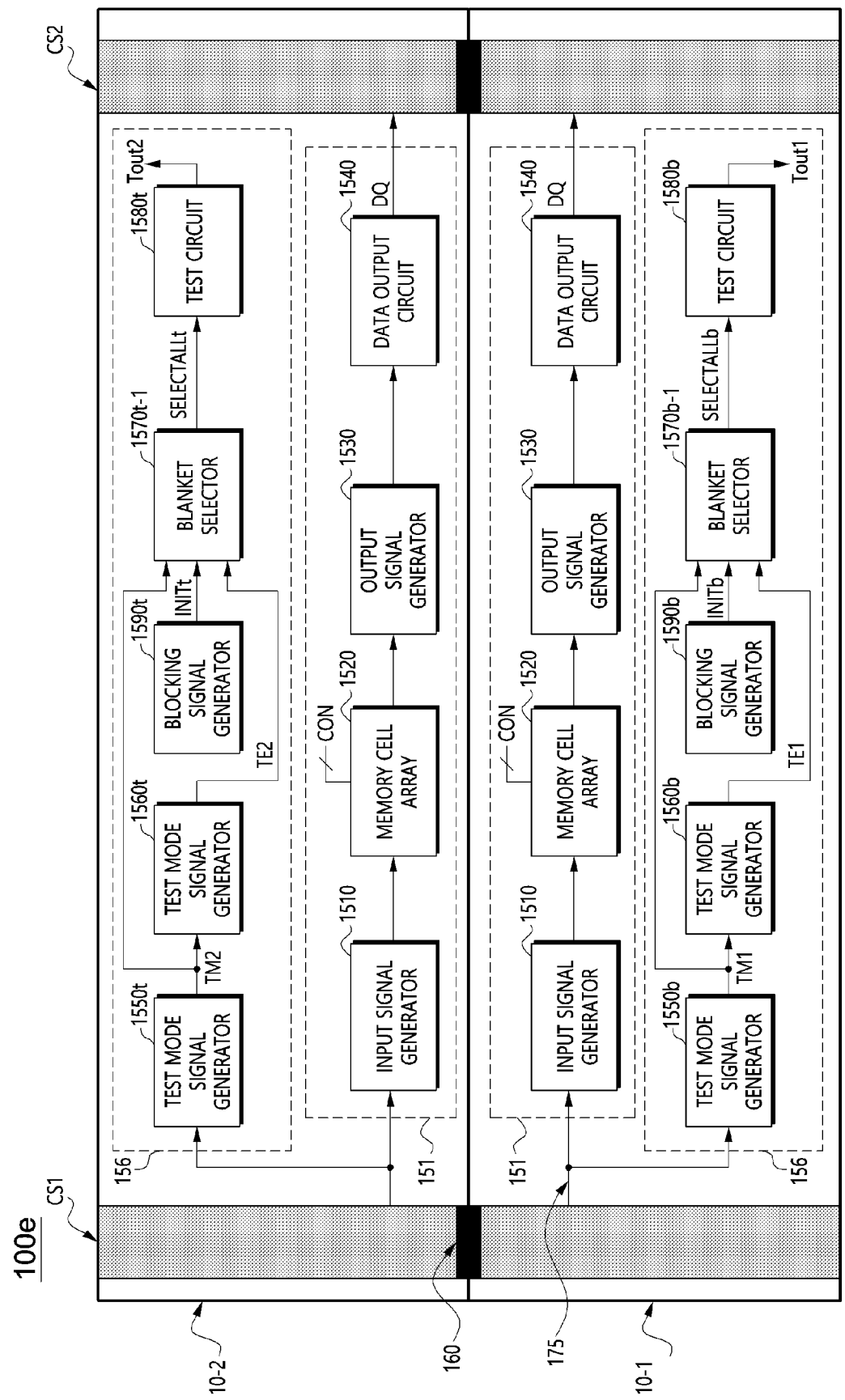
FIG. 10 is a block diagram illustrating a stack type semiconductor device for a blanket test in accordance with various examples of embodiments.
Figure 11:
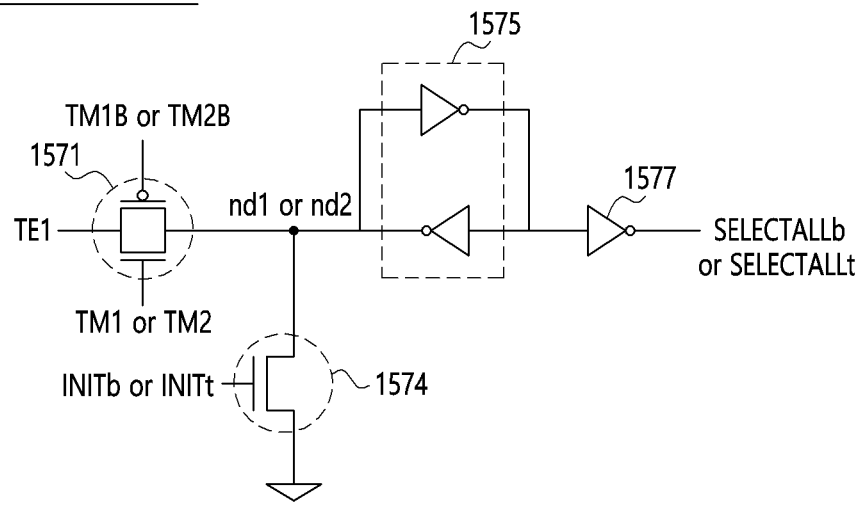
FIG. 11 is an enlarged circuit diagram illustrating a blanket selector in FIG. 10.

FIG. 10 is a block diagram illustrating a stack type semiconductor device for a blanket test in accordance with various examples of embodiments and FIG. 11 is an enlarged circuit diagram illustrating a blanket selector in FIG. 10.

Referring to FIG. 10, a stack type semiconductor device 100*e* may include stacked first and second chips 10-1 and 10-2 hybrid-bonded to each other. Each of the first and second chips 10-1 and 10-2 may include a normal logic 151 and a test logic 156.

The normal logic 151 of the first and second chips 10-1 and 10-2 may have a structure substantially the same as the structure of the normal logic 151 in FIG. 7. Thus, any further illustrations with respect to the normal logic 151 may be omitted herein for brevity.

The test logic 156 of the first and second chips 10-1 and 10-2 may have a structure substantially the same as the structure of the test logic 155 in FIG. 7 except for blanket selectors 1570*b*-1 and 1570*t*-1 and blocking signal generators 1590*b* and 1590*t*. Thus, only the blanket selectors 1570*b*-1 and 1570*t*-1 and the blocking signal generators 1590*b* and 1590*t* may be illustrated in detail.

Referring to FIGS. 10 and 11, each of the blanket selectors 1570*b*-1 and 1570*t*-1 may receive the test mode signals TM1 and TM2, the test driving signals TE1 and TE2 and blocking signals INITb and INITt to generate blanket selection signals SELECTALLb and SELECTALLt.

The blanket selectors 1570*b*-1 and 1570*t*-1 may include the transfer gate 1571, the latch 1575 and the inverter 1577 similarly to the blanket selectors 1570*b* and 1570*t* in FIGS. 8A and 8B. The blanket selectors 1570*b*-1 and 1570*t*-1 may include a blocking switch 1574 connected to the output nodes nd1 and nd2 in place of the reset switch 1573 in FIGS. 8A and 8B. The blocking switch 1574 may discharge the voltage level of the output nodes nd1 and nd2 based on the blocking signals INITb and INITt. For example, the blocking switch 1574 may include an NMOS transistor. The blocking signals INITb and INITt may be input into a gate of the NMOS transistor.

In various examples of embodiments, a blocking signal generator 1590*b* of the first chip 10-1 may have a configuration substantially the same as a configuration of a blocking signal generator 1590*t* of the second chip 10-2.

Figure 12:
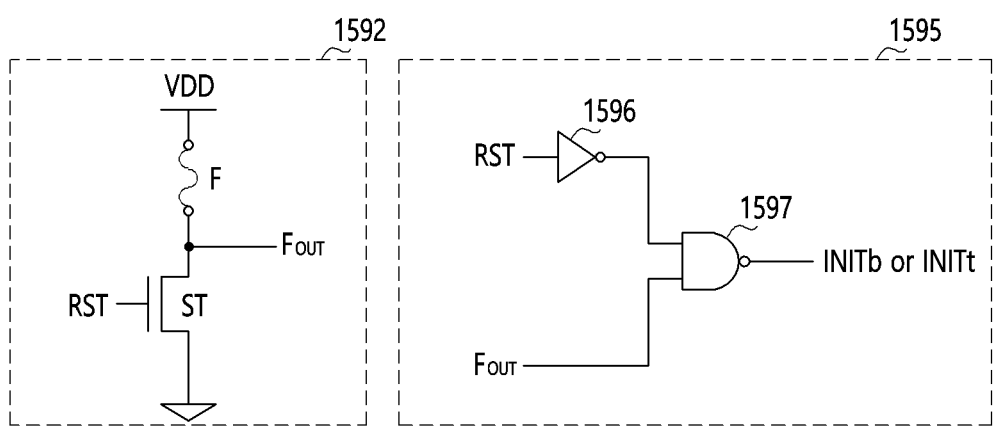
FIG. 12 is an enlarged circuit diagram illustrating a blocking signal generator in FIG. 10.

As shown in FIG. 12, the blocking signal generators 1590*b* and 1590*t* may include a fuse circuit 1592 and a signal combiner 1595.

The fuse circuit 1592 may include a fuse F. The fuse circuit 1592 may output a fuse signal Fout in accordance with a cutting of the fuse F. The fuse F may be arranged at the corresponding chip 10-1 or 10-2. When the corresponding chip 10-1 and 10-2 may be determined to be abnormal, the fuse F may be cut.

The fuse circuit 1592 may include the fuse F and a switching transistor ST. The fuse F may be connected between a power voltage terminal VDD and the switching transistor ST. When the corresponding chip 10-1 and 10-2 may be determined to be abnormal, the fuse F may be cut. The switching transistor ST may include an NMOS transistor. The switching transistor ST may be turned-on in response to the reset signal RST. The reset signal RST may be substantially the same as the reset signal RST input into the blanket selectors 1570b and 1570t in FIG. 7. The fuse signal Fout may be generated from a connection node between the fuse F and the switching transistor ST.

The signal combiner 1595 may perform a logic operation of the reset signal RST and the fuse signal Fout to generate the blocking signals INITb and INITt. When at least one of the reset signal RST and the fuse signal Fout may be enabled to the high level, the signal combiner 1595 may output the blocking signals INITb and INITt enabled to the high level.

The signal combiner 1595 may include an inverter 1596 and a NAND gate 1597. The inverter 1596 may invert the reset signal RST. The NAND gate 1597 may perform a NAND operation of the inverted reset signal and the fuse signal Fout to generate the blocking signals INITb and INITt.

Therefore, the blanket selection signals SELECTALLb and SELECTALLt may be disabled in response the blocking signals INITb and INITt for determining the failure of the semiconductor chip as well as the reset signal RST.

As a result, an additional test operation might not be performed on the first and/or second chips 10-1 and 10-2 determined to be abnormal in the wafer test after the hybrid bonding process.

As mentioned above, after completing the FEOL process and the BEOL process on the wafer, the wafer test such as the probe test or the burn-in test may be performed. Whether a defect may be generated at a specific position of the semiconductor chip or not may be recognized through the wafer test. When numbers of the defect in the semiconductor chip are within an allowable range, the semiconductor chip may be determined to be normal. In contrast, when numbers of the defect in the semiconductor chip are beyond the allowable range, the semiconductor chip may be determined to be abnormal.

When the wafers are hybrid-bonded to each other after the wafer test, although the semiconductor chip may be determined to be abnormal, the abnormal chip may be bonded together with the semiconductor chip of other wafer. Thus, the stack type semiconductor chip 100d may include the abnormal chip.

However, according to various examples of embodiments, the test logic 156 may include the blocking signal generators 1590b and 1590t. Thus, the blocking signal generators 1590b and 1590t of the semiconductor chip, which are determined to be abnormal in the wafer test, may output the blocking signals INITb and INITt enabled to the high level. Thus, the blanket selectors 1570b-1 1570t-1 of the abnormal chip may output the disabled blanket selection signals SELECTALLb and SELECTALLt so that the test might not be performed on the abnormal chip after the bonding process.

Therefore, although the stack type semiconductor device may include the stacked semiconductor chips, the stack type semiconductor device may perform the test operation as a single chip package in view of the operation so that the stack type semiconductor device may be used as the single chip package.

In various examples of embodiments, the wafers may be hybrid-bonded to each other, not limited thereto. Alternatively, the wafers bonded by various manners may be tested using various examples of embodiments.

According to various examples of embodiments, after bonding the wafers, the semiconductor chip of each of the wafers or the stacked wafers may be electrically tested. In an embodiment, the failure of the chip and the position of the failure at the chip may be accurately predicted based on the test result.

The above described embodiments are intended to illustrate and not to limit the embodiments. Various alternatives and equivalents are possible. The disclosure is not limited by the embodiments described herein. Nor are the embodiments limited to any specific type of semiconductor device. Other additions, subtractions, or modifications are obvious in view of the present disclosure and are intended to fall within the scope of the appended claims.

What is claimed is:

1. A stack type semiconductor device comprising:
a first wafer including at least one first chip; and
a second wafer including at least one second chip electrically connected with the first chip,
wherein each of the first and second chips comprises:
a test circuit block configured to perform a test operation based on a test signal;
at least one test bonding pad arranged on a bonding surface of the first and second chips to transmit the test signal and signals, which are used for driving the test circuit block; and
a hybrid bonding member configured to electrically connect the test bonding pads of the first and second chips with each other,
wherein the test circuit block of the first chip comprises a first test circuit configured to detect a failure of the first chip, a first driving signal generator configured to output a first test driving signal enabled when the test signal is a first level, and a first blanket selector configured to receive the enabled first test driving signal from the first driving signal generator and continuously output the enabled first test driving signal as a first blanket selection signal regardless of a level change of the test signal to the first test circuit, and
wherein the test circuit block of the second chip comprises a second test circuit configured to detect a failure of the second chip, a second driving signal generator configured to output a second test driving signal enabled when the test signal is a second level opposite to the first level, and a second blanket selector configured to receive the enabled second test driving signal from the second driving signal generator and continuously output the enabled second test driving signal as a second blanket selection signal regardless of a level change of the test signal to the second test circuit.

2. The stack type semiconductor device of claim 1, wherein each of the first and second blanket selectors receives a reset signal as a control signal, and each of the first and second blanket selectors disables the first and second blanket selection signals when the reset signal is enabled.

3. The stack type semiconductor device of claim 1, wherein the first blanket selector receives a first blocking signal as a control signal, and each of the first blanket selector disables the first blanket selection signal when the first blocking signal is enabled, and
the second blanket selector receives a second blocking signal as the control signal, and the second blanket selector disables the second blanket selection signal when the second blocking signal is enabled.

4. The stack type semiconductor device of claim 3, wherein the first blocking signal is enabled when the first chip is determined to be abnormal before bonding the first wafer to the second wafer, and the second blocking signal is enabled when the second chip is determined to be abnormal before bonding the first wafer to the second wafer.

5. A stack type semiconductor device comprising:
a lower wafer including a plurality of first chips, each of the first chips including a first test logic;
an upper wafer stacked on the lower wafer, the upper wafer including a plurality of second chips bonded to the first chips, each of the second chips including a second test logic; and
a plurality of connection structures formed through the bonded first and second chips to transmit electrical signals of the first and second chips,
wherein the first and second test logics detect a bonding failure of the first and second chips in response to a signal transmitted from at least one of the connection structures,
wherein the first and second test logics are simultaneously driven in response to a test signal transmitted from at least one of the connection structures,
wherein the first test logic comprises a first test circuit configured to detect a failure of the first chip, a first driving signal generator configured to output a first test driving signal enabled when the test signal is a first level, and a first blanket selector configured to receive the enabled first test driving signal from the first driving signal generator and continuously output the enabled first test driving signal as a first blanket selection signal regardless of a level change of the test signal to the first test circuit, and
wherein the second test logic comprises a second test circuit configured to detect a failure of the second chip, a second driving signal generator configured to output a second test driving signal enabled when the test signal is a second level opposite to the first level, and a second blanket selector configured to receive the enabled second test driving signal from the second driving signal generator and continuously output the enabled second test driving signal as a second blanket selection signal regardless of a level change of the test signal to the second test circuit.

6. The stack type semiconductor device of claim 5, wherein each of the connection structures comprises:
a through silicon via (TSV) formed through each of the first and second chips;
a first pad arranged on a first surface of the first chip and electrically connected to the TSV of the first chip;
a second pad arranged on a second surface of the second chip, which faces the first surface of the first chip, and electrically connected to the TSV of the second chip; and
a hybrid bonding member configured to electrically connect the first pad with the second pad.

7. The stack type semiconductor device of claim 6, wherein the hybrid bonding member comprises at least one insulation pattern and at least one conductive pattern.

8. The stack type semiconductor device of claim 5, wherein each of the first and second blanket selectors receives a reset signal as a control signal, and the first and second blanket selectors disables the first and second blanket selection signals when the reset signal is enabled.

9. The stack type semiconductor device of claim 5, wherein the first blanket selector receives a first blocking signal as a control signal, and the first blanket selector disables the first blanket selection signal when the first blocking signal is enabled, and
the second blanket selector receives a second blocking signal as the control signal, and the second blanket selector disables the second blanket selection signal when the second blocking signal is enabled.

10. The stack type semiconductor device of claim 9, wherein each of the first and second chips comprises a fuse that is cut when a corresponding chip among the first and second chips is determined to be abnormal, and
the first and second blocking signals are selectively enabled in response to the cutting of the fuse.

* * * * *